United States Patent
Lu et al.

(10) Patent No.: US 9,495,243 B2
(45) Date of Patent: Nov. 15, 2016

(54) ERROR CORRECTING CODE ENCODER SUPPORTING MULTIPLE CODE RATES AND THROUGHPUT SPEEDS FOR DATA STORAGE SYSTEMS

(71) Applicant: Western Digital Technologies, Inc., Irvine, CA (US)

(72) Inventors: Guangming Lu, Irvine, CA (US); Leader Ho, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/841,607

(22) Filed: Aug. 31, 2015

(65) Prior Publication Data
US 2015/0370633 A1  Dec. 24, 2015

Related U.S. Application Data (63) Continuation of application No. 13/718,289, filed on Dec. 18, 2012, now Pat. No. 9,122,625.

(51) Int. Cl.
G11C 29/52 (2006.01)
G06F 11/10 (2006.01)

(52) U.S. Cl.
CPC ....... G06F 11/1068 (2013.01); G06F 11/1048 (2013.01); G06F 11/1072 (2013.01); G11C 29/52 (2013.01)

(58) Field of Classification Search
CPC ........... G06F 11/1048; G06F 11/1072; G06F 11/1068; G11C 29/52
See application file for complete search history.

(56) References Cited

U.S. PATENT DOCUMENTS

| | | |
|---|---|---|
| 2,728,222 A | 12/1955 | Becker et al. |
| 4,760,358 A | 7/1988 | Inoue |
| 5,118,982 A | 6/1992 | Inoue et al. |
| 5,262,643 A | 11/1993 | Hammond et al. |
| 5,301,558 A | 4/1994 | Livingston et al. |
| RE37,030 E | 1/2001 | Lloyd et al. |
| 6,249,890 B1 | 6/2001 | Ukani et al. |
| 6,510,752 B1 | 1/2003 | Sacks et al. |
| 6,556,028 B1 | 4/2003 | Umanskiy et al. |
| 6,556,933 B1 | 4/2003 | Sacks et al. |
| 6,639,411 B1 | 10/2003 | Thomsen |
| 6,831,807 B2 | 12/2004 | Koso et al. |
| 6,856,556 B1 | 2/2005 | Hajeck |
| 6,861,854 B1 | 3/2005 | Guo et al. |
| 6,870,377 B2 | 3/2005 | Thomsen |
| 6,895,547 B2 | 5/2005 | Eleftheriou et al. |
| 6,975,477 B1 | 12/2005 | Hu et al. |
| 6,977,793 B2 | 12/2005 | White et al. |
| 7,009,804 B2 | 3/2006 | Sharma et al. |

(Continued)

FOREIGN PATENT DOCUMENTS

| | | |
|---|---|---|
| UA | 20940 | 2/2007 |
| UA | 20948 | 2/2007 |

(Continued)

OTHER PUBLICATIONS

Z. Li, et al., "Efficient Encoding of Quasi-Cyclic Low-Density Parity-Check Codes", Communications, IEEE Transactions: vol. 54, No. 1, pp. 71-81, Jan. 2006.
Bernhard M.J. Leiner, "LDPC Codes—a brief Tutorial", Stud. ID: 53418L, Apr. 8, 2005, pp. 1-9.

Primary Examiner — Albert Decady
Assistant Examiner — Kyle Vallecillo
(74) Attorney, Agent, or Firm — McDermott Will & Emery LLP (57) ABSTRACT

Embodiments of ECC encoders supporting multiple code rates and throughput speeds for data storage systems are disclosed. In one embodiment, an encoder can provide for flexible and scalable encoding, particularly when quasi-cyclic low-density parity-check code (QC-LDPC) encoding is used. The encoder can be scaled in size based on, for example, the desired encoding throughput and/or computational cycle duration. The encoder can thus be used to support multiple code rates and throughput speeds. Accordingly, encoding speed and efficiency and system performance is improved.

18 Claims, 9 Drawing Sheets

(56) References Cited

U.S. PATENT DOCUMENTS

| | | |
|---|---|---|
| 7,062,698 B2 | 6/2006 | Yang |
| 7,072,134 B1 | 7/2006 | Hirano et al. |
| 7,072,417 B1 | 7/2006 | Burd et al. |
| 7,075,748 B2 | 7/2006 | White et al. |
| 7,079,338 B1 | 7/2006 | Semba et al. |
| 7,079,339 B1 | 7/2006 | Semba et al. |
| 7,106,552 B2 | 9/2006 | Hirano et al. |
| 7,124,654 B1 | 10/2006 | Davies et al. |
| 7,126,857 B2 | 10/2006 | Hajeck |
| 7,184,230 B1 | 2/2007 | Chue et al. |
| 7,336,434 B2 | 2/2008 | Lille et al. |
| 7,346,832 B2 | 3/2008 | Richardson et al. |
| 7,395,490 B2 | 7/2008 | Richardson et al. |
| 7,423,837 B2 | 9/2008 | Hutsell |
| 7,430,136 B2 | 9/2008 | Merry, Jr. et al. |
| 7,447,807 B1 | 11/2008 | Merry et al. |
| 7,500,172 B2 | 3/2009 | Shen et al. |
| 7,502,256 B2 | 3/2009 | Merry, Jr. et al. |
| 7,509,441 B1 | 3/2009 | Merry et al. |
| 7,577,892 B1 | 8/2009 | He |
| 7,596,643 B2 | 9/2009 | Merry, Jr. et al. |
| 7,653,778 B2 | 1/2010 | Merry, Jr. et al. |
| 7,657,816 B2 | 2/2010 | Cohen et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,768,276 B2 | 8/2010 | Yao |
| 7,783,950 B2 | 8/2010 | Esumi et al. |
| 7,814,393 B2 | 10/2010 | Kyung et al. |
| 7,898,855 B2 | 3/2011 | Merry, Jr. et al. |
| 7,912,991 B1 | 3/2011 | Merry et al. |
| 7,913,149 B2 | 3/2011 | Gribok et al. |
| 7,936,603 B2 | 5/2011 | Merry, Jr. et al. |
| 7,962,792 B2 | 6/2011 | Diggs et al. |
| 8,010,869 B2 | 8/2011 | Wehn et al. |
| 8,037,388 B2 | 10/2011 | Heinrich et al. |
| 8,078,918 B2 | 12/2011 | Diggs et al. |
| 8,090,899 B1 | 1/2012 | Syu |
| 8,095,851 B2 | 1/2012 | Diggs et al. |
| 8,095,859 B1 * | 1/2012 | Peterson ............... H03M 13/116 714/801 |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,161,345 B2 | 4/2012 | Graef |
| 8,166,245 B2 | 4/2012 | Diggs et al. |
| 8,171,367 B2 | 5/2012 | Gao et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,322,235 B1 | 12/2012 | Keopuang et al. |
| 8,335,049 B1 | 12/2012 | Liu et al. |
| 8,341,339 B1 | 12/2012 | Boyle et al. |
| 8,347,195 B1 | 1/2013 | Varnica et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,495,479 B1 | 7/2013 | Varnica et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,966,339 B1 | 2/2015 | Lu |
| 9,122,625 B1 * | 9/2015 | Lu ..................... G06F 11/1048 |
| 2003/0037298 A1 | 2/2003 | Eleftheriou et al. |
| 2003/0065992 A1 | 4/2003 | Yang |
| 2003/0076121 A1 | 4/2003 | Guo et al. |
| 2003/0123563 A1 | 7/2003 | Lu |
| 2004/0098659 A1 | 5/2004 | Bjerke et al. |
| 2005/0204253 A1 | 9/2005 | Sukhobok et al. |
| 2005/0216821 A1 | 9/2005 | Harada |
| 2005/0246617 A1 | 11/2005 | Kyung et al. |
| 2006/0036925 A1 | 2/2006 | Kyung et al. |
| 2006/0036933 A1 | 2/2006 | Blankenship et al. |
| 2006/0171062 A1 | 8/2006 | Hirano et al. |
| 2008/0028274 A1 | 1/2008 | Lin |
| 2008/0126908 A1 | 5/2008 | Lin |
| 2008/0165444 A1 | 7/2008 | Zafer |
| 2008/0172592 A1 | 7/2008 | Wehn et al. |
| 2008/0301521 A1 | 12/2008 | Gunnam et al. |
| 2009/0113256 A1 | 4/2009 | Radosavljevic et al. |
| 2009/0249159 A1 | 10/2009 | Lee et al. |
| 2009/0249160 A1 | 10/2009 | Gao et al. |
| 2009/0303839 A1 | 12/2009 | Narayanan et al. |
| 2010/0037121 A1 | 2/2010 | Jin et al. |
| 2010/0037674 A1 | 2/2010 | Yashchuk et al. |
| 2010/0100788 A1 | 4/2010 | Yang et al. |
| 2010/0107030 A1 | 4/2010 | Graef |
| 2010/0131819 A1 | 5/2010 | Graef |
| 2010/0169735 A1 | 7/2010 | Biscondi et al. |
| 2010/0174849 A1 | 7/2010 | Walston et al. |
| 2010/0250793 A1 | 9/2010 | Syu |
| 2010/0275088 A1 | 10/2010 | Graef |
| 2010/0318872 A1 | 12/2010 | Wang |
| 2011/0099323 A1 | 4/2011 | Syu |
| 2011/0126078 A1 | 5/2011 | Ueng et al. |
| 2011/0179333 A1 | 7/2011 | Wesel et al. |
| 2011/0246862 A1 | 10/2011 | Graef |
| 2011/0252286 A1 | 10/2011 | Li et al. |
| 2011/0252294 A1 | 10/2011 | Ng et al. |
| 2011/0283049 A1 | 11/2011 | Kang et al. |
| 2012/0079341 A1 | 3/2012 | Wajcer et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0297267 A1 | 11/2012 | Chinnici et al. |
| 2012/0324191 A1 | 12/2012 | Strange et al. |
| 2013/0031447 A1 | 1/2013 | Sharon et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0115427 A1 | 4/2014 | Lu |
| 2014/0122968 A1 * | 5/2014 | Kazi ..................... G06F 11/10 714/763 |
| 2014/0223255 A1 | 8/2014 | Lu et al. |

FOREIGN PATENT DOCUMENTS

| | | |
|---|---|---|
| WO | WO-2009128546 | 10/2009 |
| WO | WO-2011127287 | 10/2011 |

* cited by examiner

ERROR CORRECTING CODE ENCODER SUPPORTING MULTIPLE CODE RATES AND THROUGHPUT SPEEDS FOR DATA STORAGE SYSTEMS

CROSS-REFERENCE TO RELATED APPLICATIONS

The present application claims the benefit of priority under 35 U.S.C. §120 as a continuation of U.S. patent application Ser. No. 13/718,289 entitled "Error Correcting Code Encoder Supporting Multiple Code Rates and Throughput Speeds for Data Storage Systems," filed on Dec. 18, 2012, the disclosure of which is hereby incorporated by reference in its entirety for all purposes.

BACKGROUND

Technical Field

This disclosure relates to data storage systems for computer systems. More particularly, the disclosure relates to ECC encoder supporting multiple code rates and throughput speeds.

Description of the Related Art

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data can be generated and stored along with user data to facilitate error detection and/or correction. Generation of parity data can time consuming and resource intensive. Accordingly, it is desirable to provide more efficient mechanisms for generating parity data.

BRIEF DESCRIPTION OF THE DRAWINGS

Systems and methods that embody the various features of the invention will now be described with reference to the following drawings, in which.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems, such as solid state drives, typically include one or more controllers coupled with one or more non-volatile memory arrays. Depending on the type of non-volatile memory array used, stored data may be subject to corruption as a result of, for example, read/write disturbs, loss of data retention, and/or loss of endurance. Data storage systems can utilize one or more error correction or error coding mechanisms to detect and/or correct errors in the stored data. One such mechanism can determine parity data when writing user data. Parity data can be stored, for example, in a memory array. When stored user data is retrieved, parity data can be utilized to determine the integrity of the retrieved user data. If one or more errors are detected in the retrieved user data, such errors may be corrected.

Generation of parity data can involve considerable system overhead, such as processing time overhead, system resources overhead, and/or system components overhead (e.g., necessity to use additional hardware, firmware, etc.). Furthermore, storing parity data (e.g., in a memory array) can reduce memory space available for storage of user data. Accordingly, it can be advantageous for a data storage system to support different error code rates, code lengths, and/or different coding throughput speeds. For example, a data storage system can encode stored data using a higher coding rate, so that less parity data is generated and stored, when non-volatile memory is early in the lifecycle and thus has sufficient retention and/or endurance. As non-volatile memory wears out over time, the data storage system can switch to lower coding rates such that more parity data is generated to protect user data from errors. However, supporting multiple code rates, lengths, and/or throughput speeds can require adding and/or duplicating system components (hardware, firmware, etc.).

Embodiments of the present invention are directed to an ECC encoder supporting multiple code rates and throughput speeds. In one embodiment, the ECC encoder can support multiple error code rates and/or error code lengths by using nominal or no redundancy of system components. For example, the ECC encoder can be configured so that the existing encoding components can be used and/or reused for supporting various code rates and/or lengths. The ECC encoder can further support multiple error coding throughput speeds by, for example, utilizing parallel computation techniques. In other words, the architecture of the ECC encoder can be scalable and/or flexible. Accordingly, encoding efficiency and, consequently, data storage system performance can be increased without a substantial increase in the number and/or size of system components data encoding.

System Overview

Figure 1A:
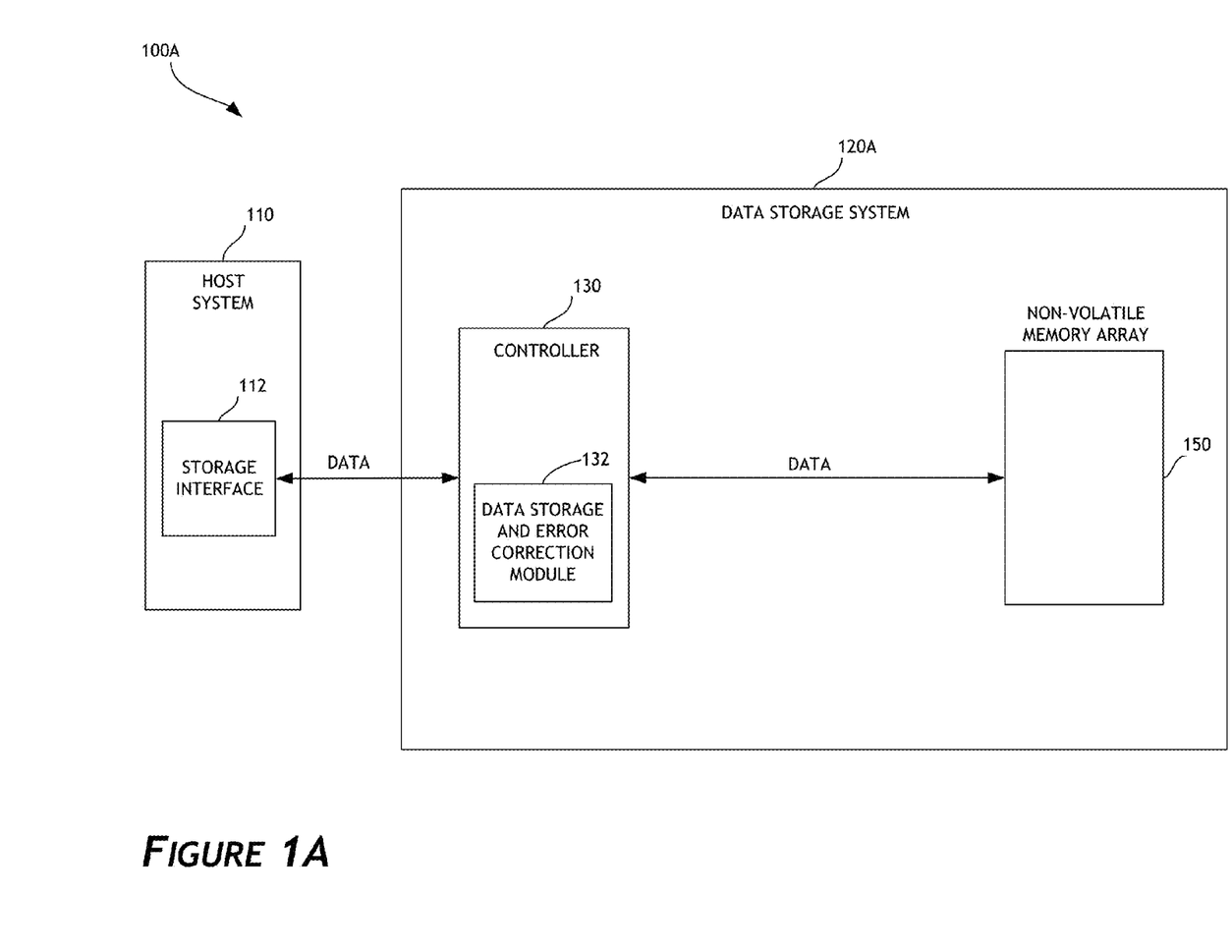
FIG. 1A illustrates a combination of a host system and a data storage system that implements ECC encoder supporting multiple code rates and throughput speeds according to one embodiment of the invention.

FIG. 1A illustrates a combination 100A of a host system and a data storage system that implements an ECC encoder supporting multiple code rates and throughput speeds according to one embodiment of the invention. As is shown, the data storage system 120A (e.g., a solid-state drive) includes a controller 130 and a non-volatile memory array 150. The non-volatile memory array 150 may comprise non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. The data storage system 120A can further comprise other types of storage.

The controller 130 can be configured to receive data and/or storage access commands from a storage interface module 112 (e.g., a device driver) of a host system 110. Storage access commands communicated by the storage interface 112 can include write data and read data commands issued by the host system 110. Read and write commands can specify a logical address (e.g., logical block addresses or LBAs) used to access the data storage system 120A. The controller 130 can execute the received commands in the non-volatile memory array 150.

Data storage system 120A can store data communicated by the host system 110. In other words, the data storage system 120A can act as memory storage for the host system 110. To facilitate this function, the controller 130 can implement a logical interface. The logical interface can present to the host system 110 data storage system's memory as a set of logical addresses (e.g., contiguous address) where user data can be stored. Internally, the controller 130 can map logical addresses to various physical locations or addresses in the non-volatile memory array 150 and/or other storage modules. The controller 130 includes a data storage and error correction module 132 configured to store data in and retrieve data from the non-volatile memory array 150, determine integrity of data retrieved from the non-volatile memory array, perform, if necessary, error correction of retrieved data, and perform transfer of data between the data storage system 120A and the host system 110.

Figure 1B:
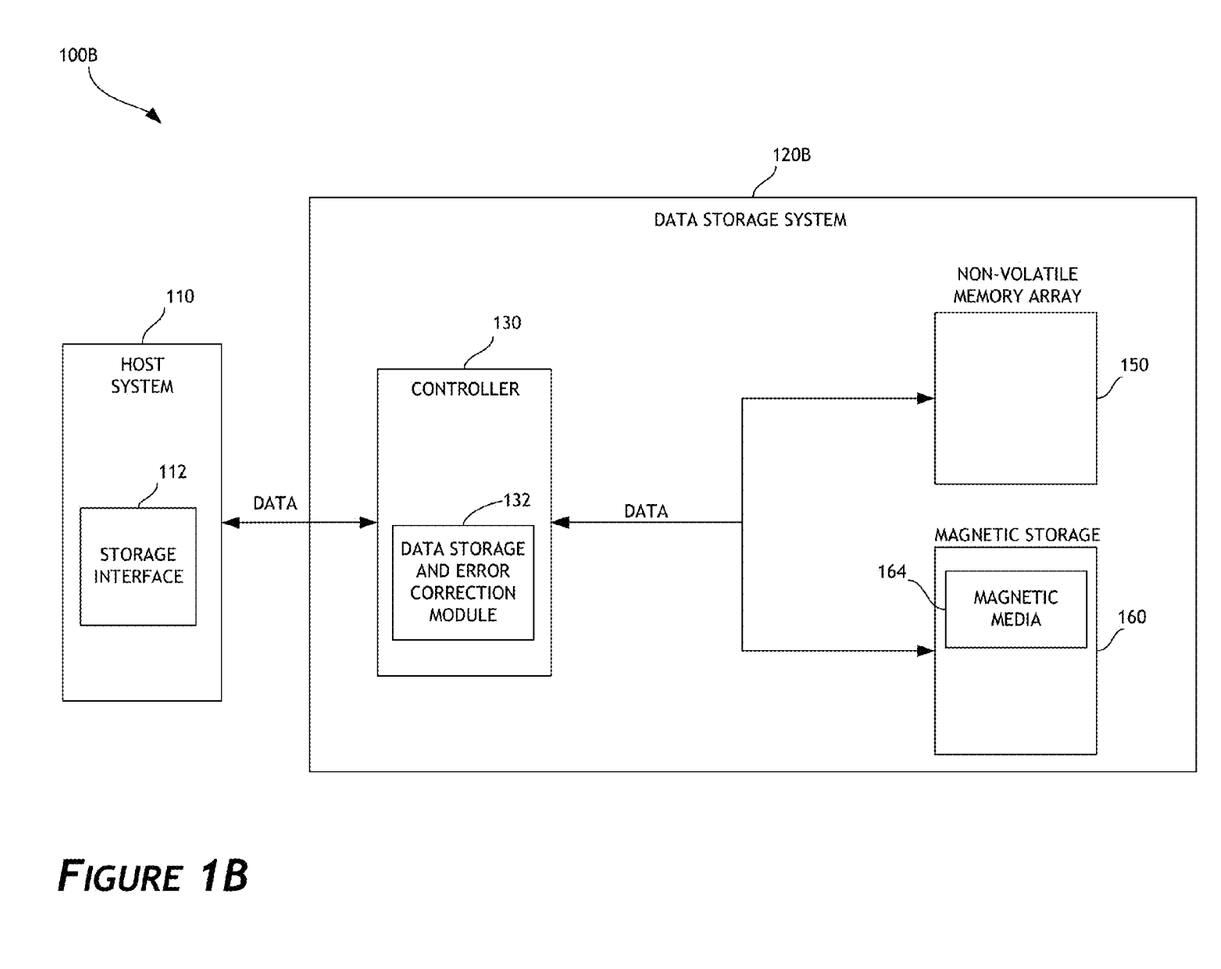
FIG. 1B illustrates a combination of a host system and a data storage system that implements ECC encoder supporting multiple code rates and throughput speeds according to another embodiment of the invention.

FIG. 1B illustrates a combination 100B of a host system and a data storage system that ECC encoder supporting multiple code rates and throughput speeds according to another embodiment of the invention. As is illustrated, data storage system 120B (e.g., hybrid disk drive) includes a controller 130, a non-volatile memory array 150, and magnetic storage 160, which comprises magnetic media 164. These and other components of the combination 100B are described above.

Overview of Low-Density Parity-Check (LDPC) Coding

In one embodiment, an ECC encoder can utilize low-density parity-check (LDPC) linear block codes for generation of data. LDPC codes can be generated using a generator matrix $G_{K \times N}$, where K=N−M corresponds to the number of information units or bits per codeword, which correspond to user data. Accordingly, M=N−k corresponds to the number parity bits. The LDPC encoder generates a codeword $u=(u_0, u_1, \ldots, u_{N-1})$ from a user data vector $v=(v0, v1, \ldots, vk-1)$ via following matrix multiplication:

$$v = u \times G \qquad (1)$$

A generator matrix of an LDPC coder can be referred to as matrix producing systematic codes if the encoded codewords include the original user data bits followed by N−K parity check bits. Such generator matrix can be represented as:

$$G_{K \times N} = [I_{K \times K} | Q_{K \times (N-K)}] \qquad (2)$$

For LDPC codes, Q submatrix of the generator matrix G is generally a high density matrix, and I submatrix is a k×k identity matrix. In one embodiment, the generator matrix G used for Quasi-Cyclic LDPC (QC-LDPC) encoding can have the following form:

$$G_{QC} = \begin{bmatrix} I & 0 & \cdots & 0 \\ 0 & I & \cdots & 0 \\ \vdots & \vdots & \ddots & \vdots \\ 0 & 0 & \cdots & I \end{bmatrix} \begin{bmatrix} G_{1,1} & G_{1,2} & \cdots & G_{1,m} \\ G_{2,1} & G_{2,2} & \cdots & G_{2,m} \\ \vdots & \vdots & \ddots & \vdots \\ G_{n-m,1} & G_{n-m,2} & \cdots & G_{n-m,m} \end{bmatrix} = [I_{(n-m)p} | Q] \qquad (3)$$

where I is a p×p identity matrix, 0 is a p×p zero matrix, $G_{i,j}$ for 1≤i≤n−m and 1≤j≤m is a p×p circulant, and n=N/p and m=M/p. In p×p circulant matrix $G_{i,j}$ row number y is rotated to the right by one as compared to row number y−1. In one embodiment, code rate for QC-LDPC encoding can be defined as:

$$R = 1 - \frac{M}{N} = 1 - \frac{m}{n} \qquad (4)$$

In one embodiment, when systematic LDPC codes are used, multiplication by a systematic portion of the generator matrix $G_{QC}$ (e.g., $I_{(n-m)p}$) may be dispensed with. In one embodiment, non-systematic portion Q of the generator matrix is not a low-density matrix. Still, matrix Q may be follow QC format (e.g., be circulant). Further, user data bits can be divided into k (or n−m) segments:

$$u = \{s_1, s_2, s_3, \ldots, s_{n-m}\} \qquad (5)$$

where $s_j$ is a jth subsegment of user data of size P (e.g., P bits). In one embodiment, $g_{i,j}$ can correspond to the first row of $G_{i,j}$ matrix and $h_{i,j}$ can correspond to the first column of $G_{i,j}$ matrix. In addition, $g_{i,j}^{(f)}$ can correspond to $g_{i,j}$ right-shifted by f and $h_{i,j}^{(f)}$ can correspond to $h_{i,j}$ right-shifted by f Jth segment of parity data with size of P bits can be represented as:

$$Q_j = s_i \times G_{i,j} = s_1 G_{1,j} + s_2 G_{2,j} + \ldots + s_{n-m} G_{n-m,j} \qquad (6)$$

Figure 2:
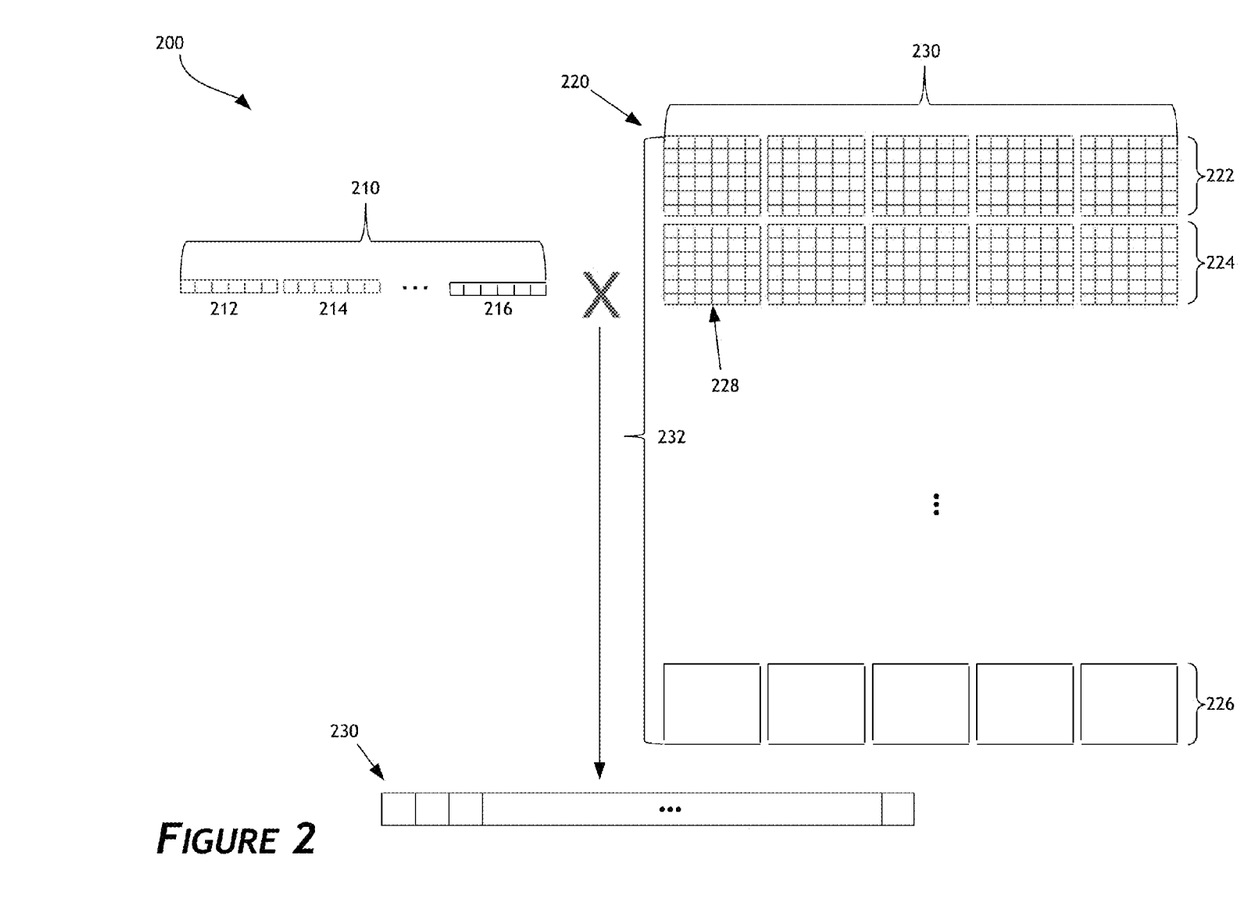
FIG. 2 illustrates encoding performed by ECC encoder supporting multiple code rates and throughput speeds according to one embodiment of the invention.

FIG. 2 illustrates encoding 200 performed by an ECC encoder supporting multiple code rates and throughput speeds according to one embodiment of the invention. In one embodiment, matrix multiplication is performed by the controller 130 and/or data storage and error correction module 132. Row 210 represents a segment of user data having length k. This segment comprises subsegments 212, 214, . . . , 216 having length P, where P is an integer (e.g., 128, 256, 512, 1024, etc.). Matrix 220 represents generator matrix G. In one embodiment, matrix 220 can correspond to matrix Q of equation (3). Matrix 220 can be divided into a plurality of submatrices 228, which can be, for example, of size P×P. The number of submatrices 228 along the column dimension 230 of matrix 220 can be, for example, n−k, (n−k)/P, and so on. The number of submatrices 228 along the row dimension 232 of matrix 220 can be, for example, k, k/P, and so on. In one embodiment, there are m submatrices 228 along the column dimension 230 of matrix 220.

In one embodiment, encoding 200 can include the following operations. User data 210 subsegment 212 can be multiplied by submatrices 228 in row 222 in order to determine:

$$Q_j = s_1 G_{1,j} \text{ for } j = \{0, m-1\} \quad (7a)$$

User data 210 subsegment 214 can be multiplied by submatrices 228 in row 224 in order to determine:

$$Q_j = Q_j + s_2 G_{2,j} \text{ for } j = \{0, m-1\} \quad (7b)$$

These multiplication operations can be continued and $Q_j$ of equation (6) can be determined as follows:

$$Q_j = Q_j + s_{n-m} G_{n-m,j} \text{ for } j = \{0, m-1\} \quad (7c)$$

Finally, user data 210 subsegment 216 can be multiplied by submatrices 228 in row 226 in order to determine the final value of $Q_j$. The result can be saved in a row vector 230.

ECC Encoder Supporting Multiple Code Rates and Throughput Speeds

Figure 3:
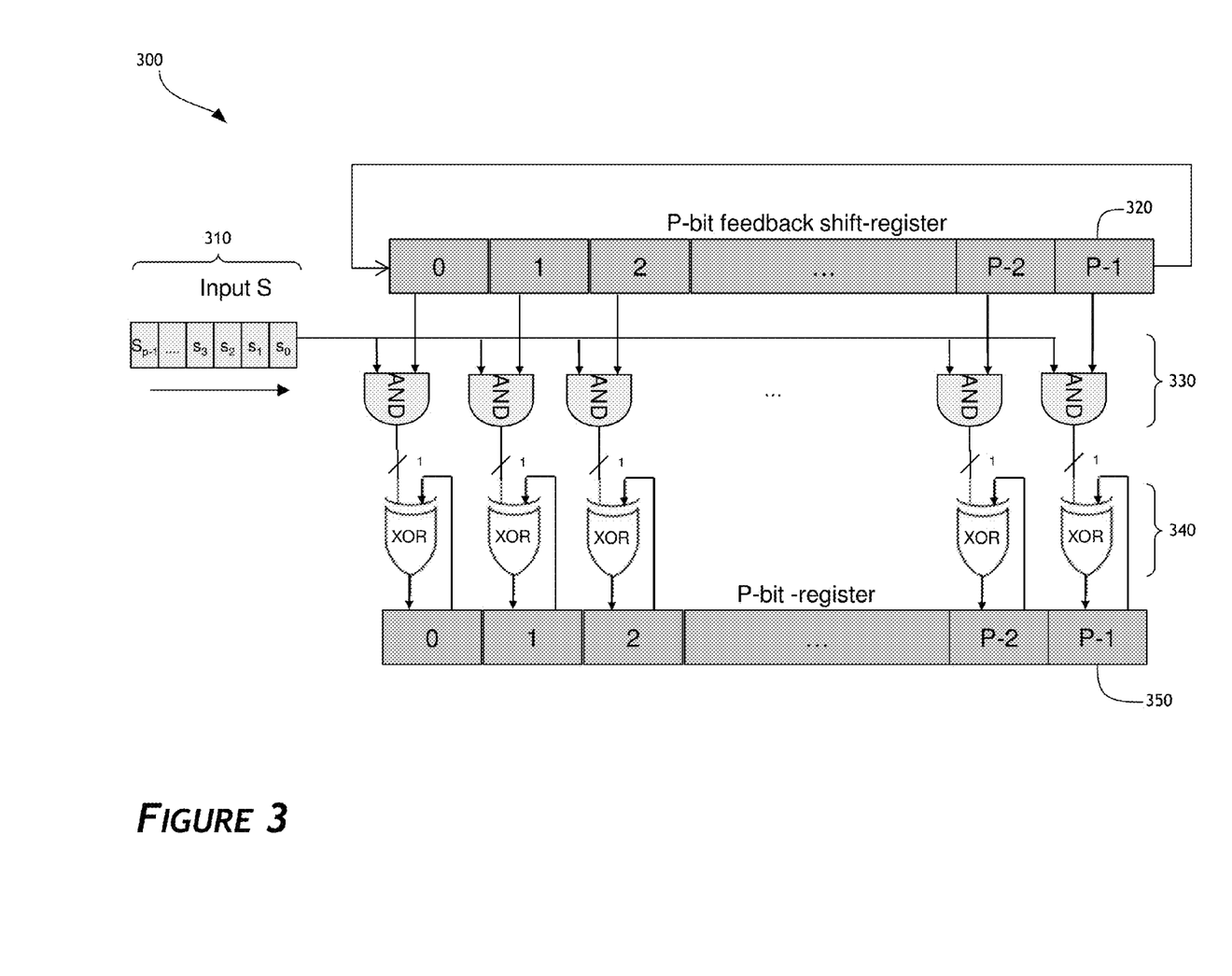
FIG. 3 illustrates a block diagram of a portion of ECC encoder supporting multiple code rates and throughput speeds according to one embodiment of the invention.

FIG. 3 illustrates a block diagram of a portion of ECC encoder 300 supporting multiple code rates and throughput speeds according to one embodiment of the invention. In one embodiment, the encoder 300 can perform the multiplication $s_i \times G_{i,j}$ of equation (6). Register 310 can be configured to store a subsegment of user data (e.g., of size p). Register 320 can be configured to store a row of a submatrix 228 (e.g., of size 1×p) of the matrix G. In one embodiment, such as for example when encoder 300 is configured to perform QC-LDPC encoding, matrix G can be a circulant matrix and the submatrix can also be circulant. Accordingly, shifting or rotating (e.g., to the left or the right) the content of register 320 can produce a next row of the submatrix. As a result, only one row of the submatrix can be stored in the register 320 for performing the multiplication $s_i \times G_{i,j}$ of equation (6). Logic gates 330 and 340 can be configured to perform the multiplication operations. In one embodiment, AND and XOR gates can be utilized. In other embodiments, any other suitable combinations of logic gates can be used, such as NAND, OR, NOR, etc. Register 350 can be configured to store the result of the multiplication.

In one embodiment, the encoder 300 can determine $s_i \times G_{i,j}$ as follows. A row $g_{i,j}$ of the submatrix is loaded into the register 320 and next user subsegment (e.g., of size p bits) is loaded in the register 310. Every computational cycle one bit $s_i$ of register 310 is feed to as input into the logic gates 330. This can be accomplished by right shifting the register 310. The result of the multiplication by $s_i$ is computed and stored in the register 350, which can indicate a completion of a computational cycle. In one embodiment, a computational cycle can correspond to a system clock cycle. At the start of the next computational cycle, the contents of the register 320 can be right-rotated by one, which results in loading the next row of the submatrix. Then, the next bit $s_i$ from register 310 is feed as input to the logic gates 330, and the foregoing process is repeated. In one embodiment, the contents of the register 320 are right-rotated by one every computational cycle. It can take a total of P computational cycles to perform the operation $s_i \times G_{i,j}$. At the completion of P cycles, the encoder 300 can compute $s_i \times G_{i+1,j}$ by loading a row $g_{i+1,j}$ of the next submatrix into the register 320. As is illustrated in FIG. 3, the encoder 300 comprises three registers having size P, P logic gates 330 (e.g., AND gates), and P logic gates 340 (e.g., XOR). The encoder 300 can be referred to as shift-register-adder-accumulator (SRAA).

In one embodiment, any number of encoders 300 can be utilized in order to improve throughput associated with the computation of parity data. In one embodiment, an LDPC encoder comprising, for example, an encoding module having five encoders 300 configured to compute parity data associated with user data in parallel may still provide throughput below a target throughput. For instance, the throughput in one embodiment can be about 100 MBytes/s when clock frequency of about 800 MHz is used. Many encoding modules may be needed to achieve higher throughput. For example, 80 or more encoding modules may be needed to achieve the throughput of about 8 GBytes/s or higher, with each encoding module having five encoders 300. In such configuration, the overall logic may comprise multiple million(s) of logic gates and use a large amount of buffer memory.

Figure 4:
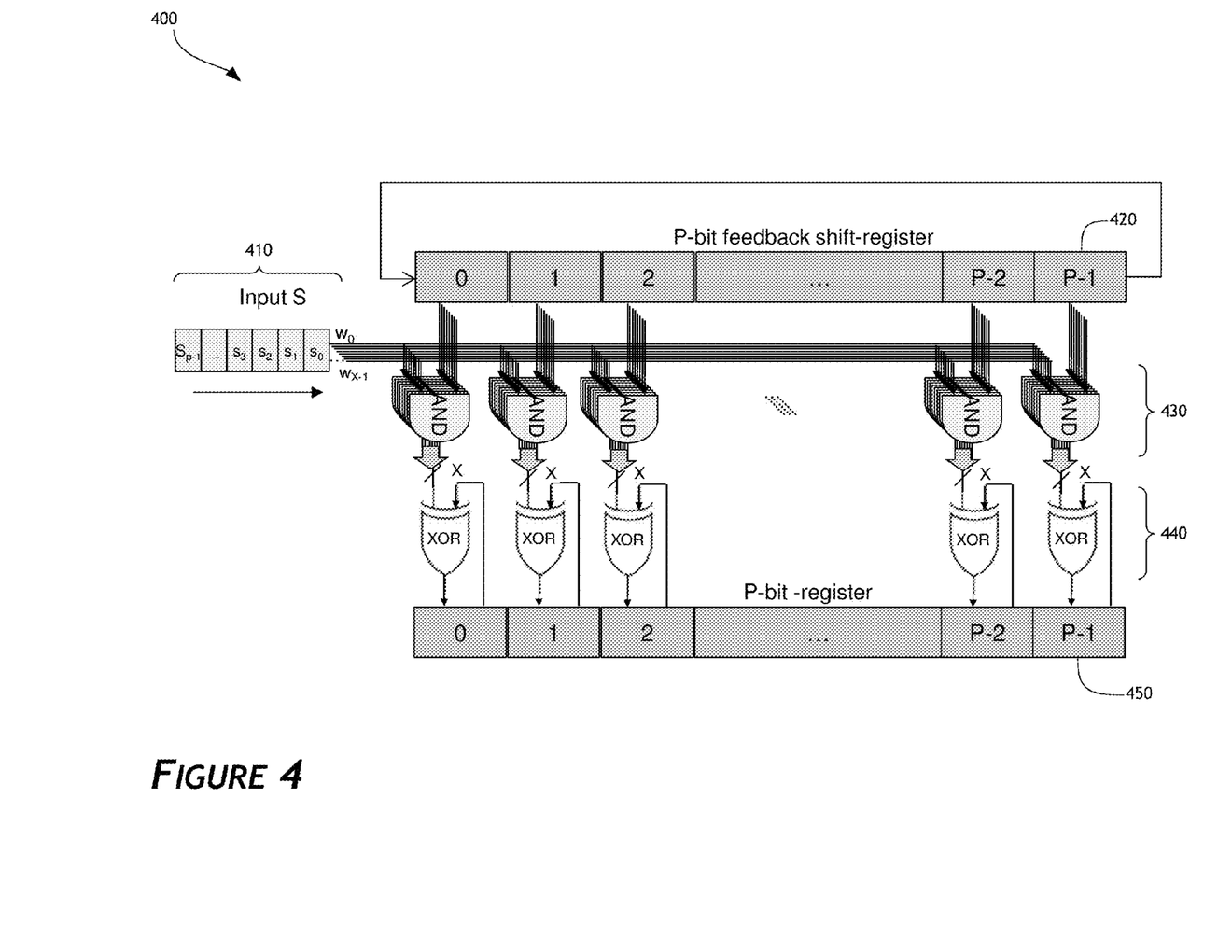
FIG. 4 illustrates a block diagram of a portion of ECC encoder supporting multiple code rates and throughput speeds according to another embodiment of the invention.

FIG. 4 illustrates a block diagram of a portion of ECC encoder 400 supporting multiple code rates and throughput speeds according to another embodiment of the invention. In one embodiment, the encoder 400 can perform the multiplication $s_i \times G_{i,j}$ of equation (6). Register 410 can be configured to store a subsegment of user data (e.g., of size p). Register 420 can be configured to store a row of a submatrix 228 (e.g., of size 1×p) of the matrix G. In one embodiment, such as for example when encoder 400 is configured to perform QC-LDPC encoding, matrix G can be a circulant matrix and the submatrix can also be circulant. Accordingly, shifting or rotating (e.g., to the left or the right) the content of register 420 can produce a next row of the submatrix. As a result, only one row of the submatrix can be stored in the register 420 for performing the multiplication $s_i \times G_{i,j}$ of equation (6). Logic gates 430 and 440 can be configured to perform the multiplication operations. In one embodiment, AND and XOR gates can be utilized. In other embodiments, any other suitable combinations of logic gates can be used, such as NAND, OR, NOR, etc. Register 450 can be configured to store the result of the multiplication.

In one embodiment, the encoder 400 is configured to perform in parallel and/or substantially in parallel multiplication of X bits of user data stored in the register 410. X can be an integer value, such as 2, 8, 16, 32, 64, and so on, and X corresponds to the internal parallelism of the encoder 400. In some embodiments, the internal parallelism can be scaled up and/or down depending on the desired tradeoff between throughput of the encoder and size of logic associated with the encoder.

In one embodiment, the encoder 400 configured can determine $s_i \times G_{i,j}$ as follows. The encoder 400 can be configured with X=32. A row $g_{i,j}$ of the submatrix is loaded into the register 420 and next user subsegment (e.g., of size p bits) is loaded in the register 410. Every computational cycle X bits (e.g., 32 bits or 4 bytes) of user data $s_{i,X}$ stored in register 410 are feed as input to the logic gates 430. This can be accomplished by right shifting the register 410 by X. The result of the multiplication by $s_{i,X}$ is computed and stored in the register 450, which can indicate a completion of a computational cycle. At the start of the next computational cycle, the contents of the register 420 can be right-rotated by X (e.g., 32 bits or 4 bytes). Then, the next X bits $s_{i+1,X}$ stored in register 410 is feed to as input into the logic gates 430, and the foregoing process is repeated. In one embodiment, the contents of the register 420 are right-rotated by X every computational cycle. In one embodiment, there are X−1 virtual copies of the register 420 having corresponding matrix data corresponding to right-rotated data by 1, 2, . . . , X−1. It can take a total of P/X (e.g., P/32) computational cycles to perform the operation $s_i \times G_{i,j}$. At the completion of P/X cycles, the encoder 400 can compute the $s_i \times G_{i+1,j}$ by loading a row $g_{i+1,j}$ of the next submatrix into the register 420. As is illustrated in FIG. 4, the encoder 400 comprises three registers having size P, X*P logic gates 430 (e.g., AND gates) having X inputs, and P logic gates 440 (e.g., XOR) having X+1 inputs.

Figure 5A:
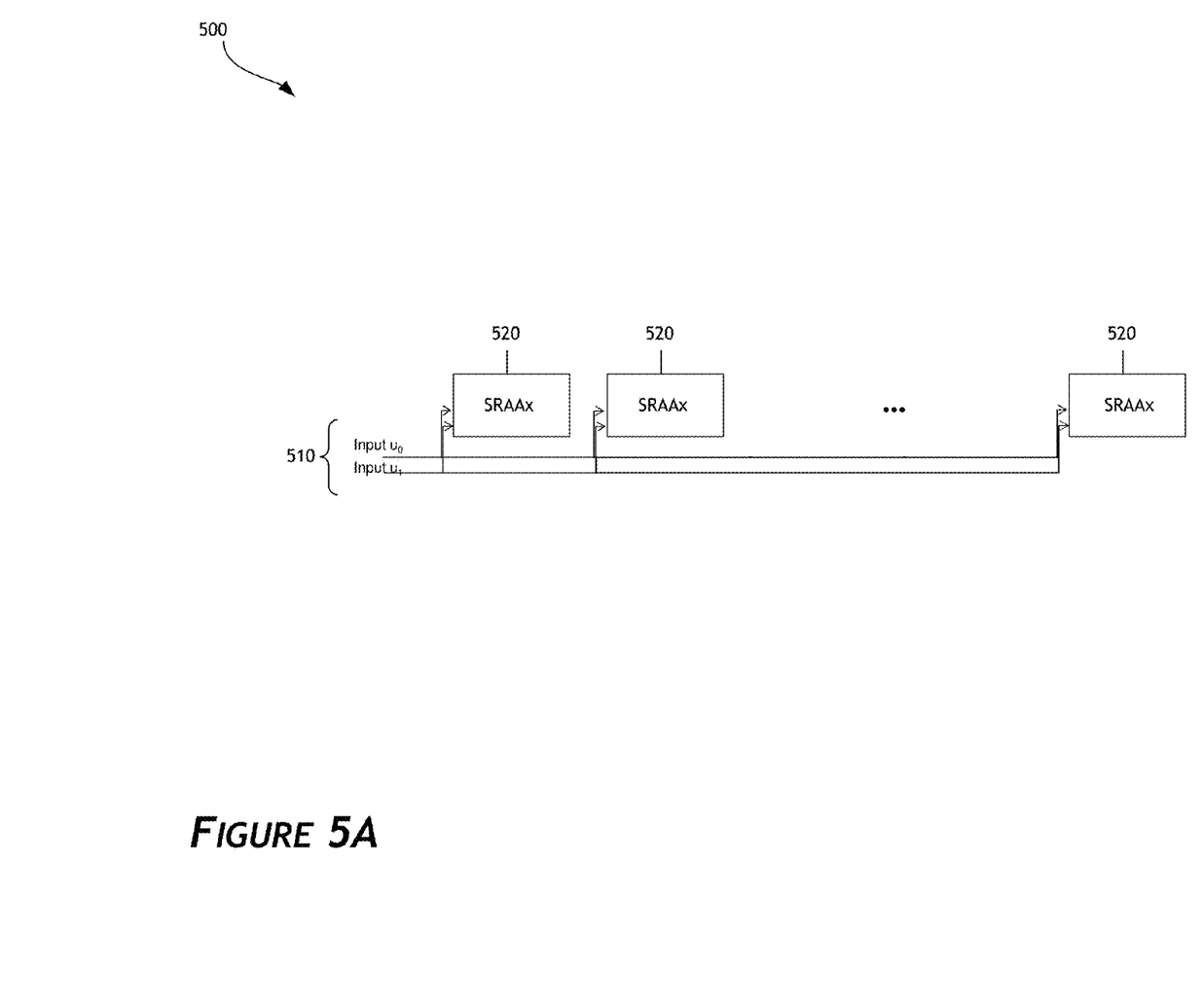
FIG. 5A illustrates a data path of ECC encoder supporting multiple code rates and throughput speeds according to one embodiment of the invention.

FIG. 5A illustrates a data path of ECC encoder 500 supporting multiple code rates and throughput speeds according to one embodiment of the invention. The encoder 500 comprises a plurality of encoder modules 520 configured to compute in parallel and/or substantially in parallel parity data associated with a plurality of user data units 510, each unit comprising subsegments of user data. In one embodiment, the encoder 400 illustrated in FIG. 4 can be used as the encoder modules 520. In one embodiment, the throughput of the encoder 500 can be determined according to X*frequency of the system clock. For example, when X=32 and frequency of the clock is about 800 MHz, the throughput of the encoder 500 is about 3200 MBytes/s (or about 3.2 GBytes/s).

In one embodiment, a number of encoder modules 520 can be selected in accordance with a desired throughput. For example, the number of encoder modules can be 1, 2, 3, 4, and so on. In one embodiment, the upper limit on the number of encoder modules can be selected as a number of submatrices in the generator matrix. In such embodiment, parity data can be determined in parallel or substantially in parallel using all submatrices. In one embodiment, coding rate of the encoder 500 can be selected based on the combination of the number of submatrices and the value of P. In another embodiment, coding rate of the encoder 500 can be selected based on the combination of the values of X and P.

Figure 5B:
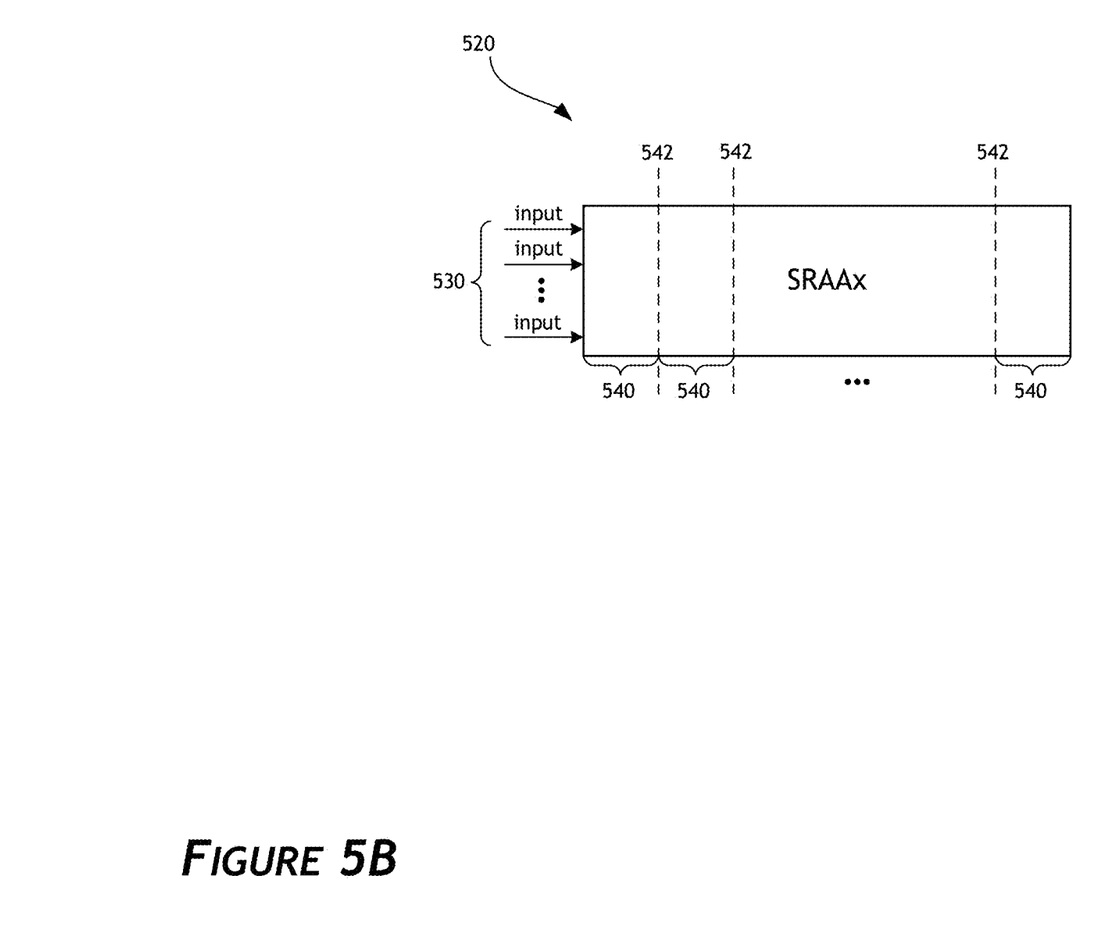
FIG. 5B illustrates an encoder module of ECC encoder supporting multiple code rates and throughput speeds according to one embodiment of the invention.

FIG. 5B illustrates an encoder module 520 of the ECC encoder 500 supporting multiple code rates and throughput speeds according to one embodiment of the invention. As is illustrated, the encoder module 520 accepts and operates on one or more subunits of user data 530. The encoder module 520 can be partitioned into a plurality of encoding blocks 540. The partitioning is depicted by lines 542. One or more encoding blocks 540 can be configured to compute parity data associated with one or more subunits of user data. In one embodiment, one or more encoding block 540 can be configured with desired X and/or P. For example, the encoder module 520 can be configured as: one encoding block 540 with X=32 and P=1024, one encoding block 540 with X=32 and P=512 and one encoding block 540 with X=32 and P=256, two encoding blocks 540 with X=32 and P=256, four encoding blocks 540 with X=32 and P=256, two encoding blocks 540 with X=32 and P=512, and so on. In one embodiment, configuring the encoder module blocks 540 with X=32 and P=1024 can result in a throughput of about 3.2 GBytes/s. In one embodiment, configuring the encoder module 520 as one encoding block 540 with X=32 and P=512 and one encoding block 540 with X=32 and P=256 can provide throughput of about 6.4 GBytes/s.

Figure 6:
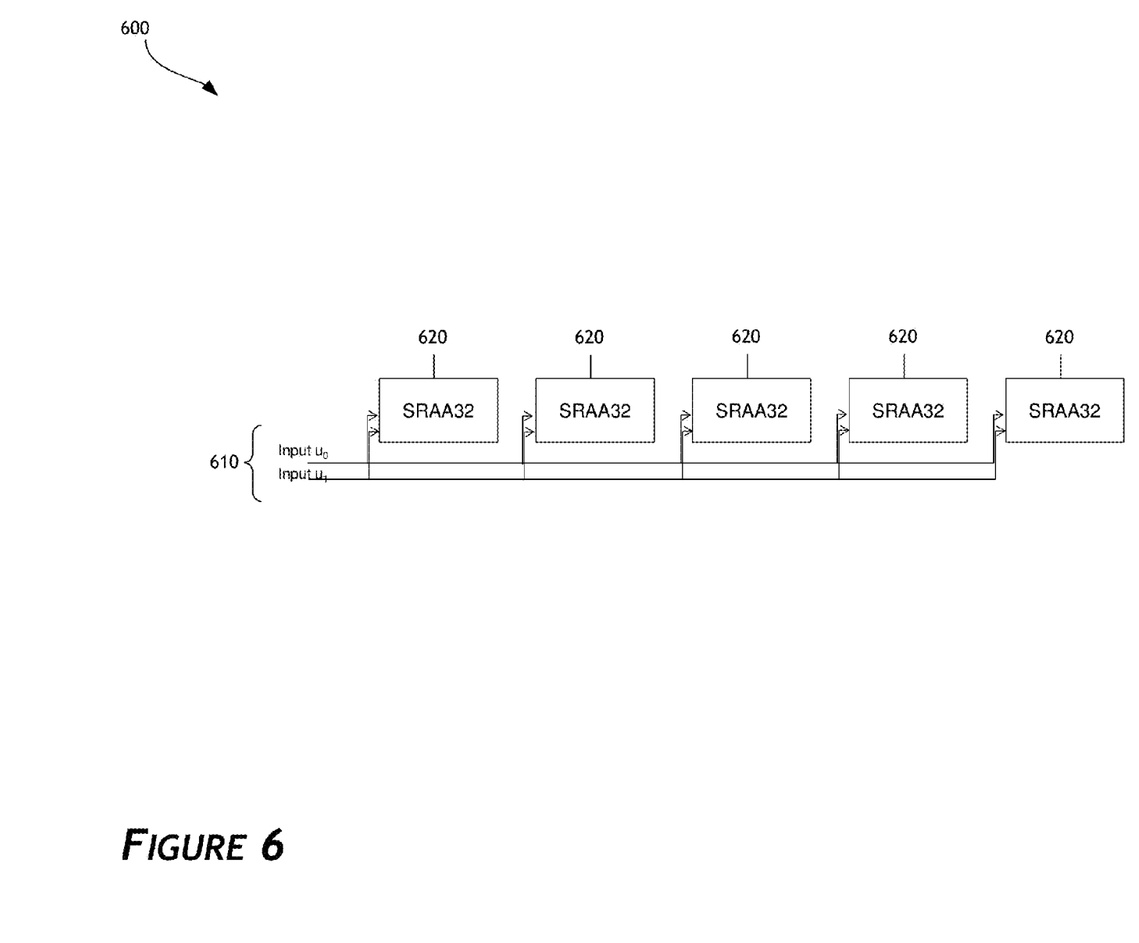
FIG. 6 illustrates a data path of ECC encoder supporting multiple code rates and throughput speeds according to another embodiment of the invention.

FIG. 6 illustrates a data path of ECC encoder 600 supporting multiple code rates and throughput speeds according to another embodiment of the invention. As is illustrated, the encoder 600 comprises five encoder modules 620 operating on user data 610. In one embodiment, the encoder modules 620 can be configured with X=32. Such configuration can be used to determine parity data using 4/5*P parity submatrix. The number of computational cycles for determining parity data can be proportional to the size (e.g., length) of the user data. In another embodiment, one or more encoder modules 620 can be configured with any suitable value(s) of A. In one embodiment, configuring the encoder module 620 with one encoding block having X=32 and P=1024 may cause the encoder module to wait until the encoding operations are completed for a current subunit of user data before encoding next subunit of user data.

In one embodiment, each encoder module 620 includes three registers having size P, X*P logic gates (e.g., logic gates 430) having X inputs, and P logic gates (e.g., logic gates 440) having X+1 inputs. Accordingly, the encoder 600 includes 15 register groups having size P, 5*X*P logic gates having X inputs, and 5*P logic gates having X+1 inputs. For example, for X=32 the encoder 600 includes 15 register groups having size P, 160*P logic gates having 32 inputs, and P logic gates having X+33 inputs. In one embodiment, a double buffer may be used for registers 410, 420, and/or 450 of FIG. 4 to provide a sustained throughput, such as to provide output and queue input simultaneously or nearly simultaneously. In one embodiment, routing complexity associated with the logic of the encoder module 620 may increase with increase in X.

Figure 7:
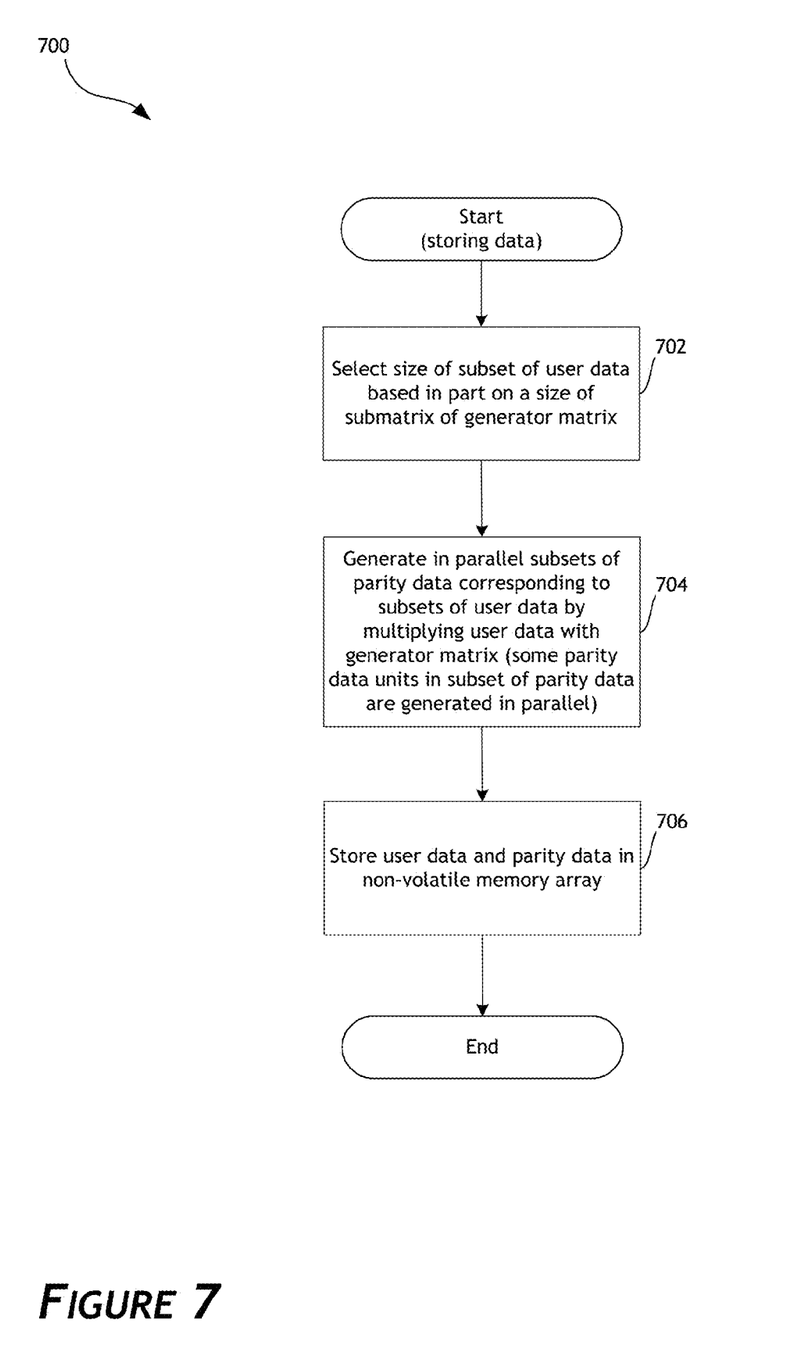
FIG. 7 is a flow diagram illustrating a process of storing data according to one embodiment of the invention.

FIG. 7 is a flow diagram illustrating a process 700 of storing data according to one embodiment of the invention. The process 700 can be executed by the controller 130 and/or the data storage and error correction module 132. The process 700 starts in block 702 where it selects size of a subset or subsegment of user data to be stored. The selection can be performed based in part on a size (e.g., P) of the submatrices of the generator matrix. For example, as explained above, user data subsegments of size P can be selected. In block 704, the process 700 generates in parallel or substantially in parallel subsets of parity data corresponding to the subsegments of user data. As is explained above, parity data can be generated by multiplying subsegments of user data by the plurality of submatrices of the generator matrix. Further, parity data corresponding to a given subsegment of user data can be generated in parallel or substantially in parallel. For example, multiplications of the subsegment or part of the subsegment by at least some submatrices of the generator matrix can be performed in parallel or substantially in parallel. Accordingly, parity data can be generated in parallel or substantially in parallel across the subsegments of the user data as well for data bits of a given subsegment. In block 706, the process 700 stores the user data along with generated parity data in data storage system memory. For example, the process 700 can store the user data and parity data in the non-volatile memory array 150.

CONCLUSION

Utilizing ECC encoder supporting multiple code rates and throughput speeds as is disclosed herein can provide for flexible and scalable encoding of user data, particularly when QC-LDPC encoding is used. The encoder can be scaled in size based on, for example, the desired encoding throughput and/or computational cycle duration. The encoder architecture can thus be used to support multiple code rates and throughput speeds. Accordingly, encoding speed and efficiency and system performance is improved.

OTHER VARIATIONS

Those skilled in the art will appreciate that in some embodiments, other suitable error correction mechanisms can be used in addition to and/or in place of LDPC coding. For example, Hamming coding, Reed-Solomon coding, BCH coding, and the like can be used. Further, user data can encompass data provided by a host system, data generated internally by a data storage system, etc., and/or a combination thereof. Also, any suitable unit or grouping of data, such as octet, nibble, word, byte, etc., can be used in addition to or in place of a bit of user data. Moreover, when code shortening techniques are utilized, encoding may be partially or fully skipped. The actual steps taken in the disclosed processes, such as the processes illustrated in FIG. 7, may differ from those shown in the figure. Additional system components can be utilized, and disclosed system components can be combined or omitted. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
a controller configured to select one or more segment sizes from a plurality of predetermined segment sizes for encoding operations on user data received from a host system,
wherein the controller comprises a plurality of encoding modules, at least one of the encoding modules comprising an input register and being configured to receive and operate on a respective data segment of the user data to generate a plurality of subunits of encoded data based on the respective data segment of the user data and respective portions of a generator matrix loaded by the encoding module, wherein a first portion and a second portion of the respective portions each have a size corresponding to one of the selected one or more segment sizes, the size of the first portion being different than the size of the second portion, and wherein the size of the first portion and second portion are based on a different multiplication of a same submatrix size, and
wherein a first subunit of the plurality of subunits is a different size than a second subunit of the plurality of subunits.

2. The data storage system of claim 1, wherein the plurality of encoding modules are configured to receive and process a plurality of data segments including the respective data segment, from respective input registers in parallel.

3. The data storage system of claim 2, wherein a throughput of the plurality of encoding modules is based on a number of the plurality of data segments processed in parallel by the plurality of encoding modules.

4. The data storage system of claim 1, wherein the at least one encoding module is configured to operate on the respective data segment of the user data based on a computation of the first portion and the second portion of the multiple portions of the generator matrix.

5. The data storage system of claim 4, wherein the at least one portion of the generator matrix comprises a circulant submatrix, a length of the circulant submatrix corresponding to a length of a submatrix of the submatrix size.

6. The data storage system of claim 4,
wherein a throughput of the plurality of encoding modules is based at least in part on the respective sizes of the first and second portions of the generator matrix.

7. The data storage system of claim 4, wherein each encoder module of the plurality of encoding modules comprises a plurality of logic gates receiving input from the input register, wherein a number of the logic gates configured to receive input are selected based in part on a number of submatrices in the generator matrix, and wherein the number of logic gates configured to receive input is based in part on a ratio of the selected segment size to an integer N, wherein N is selected based at least in part on a desired throughput of the system.

8. The data storage system of claim 7, wherein each encoding module is configured to generate the encoded data in a number of computational cycles corresponding to the ratio.

9. The data storage system of claim 1, wherein the encoded data comprises parity data.

10. A method, comprising:
selecting one or more portion sizes of user data from a plurality of predetermined portion sizes for encoding the user data by a plurality of encoding modules;
receiving the user data; and
encoding, by the plurality of encoding modules, the received user data, at least one of the encoding modules generating encoded data for a respective portion of the user data,
wherein the at least one of the encoding modules generates a plurality of subunits of encoded data based on the respective data portion of the user data and respective divisions of a generator matrix loaded by the encoding module, wherein a first division and a second division of the respective divisions each have a size corresponding to one of the selected one or more portion sizes, the size of the first division being different than the size of the second division, and wherein the size of the first division and the second division are based on a different multiplication of a same submatrix size.

11. The method of claim 10, wherein the user data comprises a plurality of data segments, including the respective data segment, and wherein the plurality of encoding modules process the plurality of data segments in parallel.

12. The method of claim 11, wherein a throughput of the plurality of encoding modules is based on a number of the plurality of data segments processed in parallel by the plurality of encoding modules.

13. The method of claim 10, wherein the at least one encoding module is configured to operate on the respective portions of the user data based on a computation of the first portion and the second portion of the multiple portions of the generator matrix.

14. The method of claim 13, wherein the at least one portion of the generator matrix comprises a circulant submatrix, a length of the circulant submatrix corresponding to a length of a submatrix of the submatrix size.

15. The method of claim 13,
   wherein a throughput of the at least one of the encoding modules is based at least in part on the respective sizes of the first and second portions of the generator matrix.

16. The method of claim 13, wherein a respective encoder module of the plurality of encoding modules comprises a plurality of logic gates receiving bit values based on the respective portion of the user data processed by the at least one encoding module, and wherein the number of logic gates receiving bit values is equal to a ratio of the selected portion size to an integer N, the method further comprising:
   selecting N based at least in part on a desired throughput of the system.

17. The method of claim 16, wherein the at least one encoding module is configured to generate the encoded data in a number of computational cycles corresponding to the ratio.

18. The method of claim 10, wherein the encoded data comprises parity data.

\* \* \* \* \*